(12) United States Patent
Sakai et al.

(10) Patent No.: US 11,875,923 B2
(45) Date of Patent: Jan. 16, 2024

(54) NOISE REDUCTION ELEMENT

(71) Applicant: Mitsubishi Electric Corporation, Tokyo (JP)

(72) Inventors: Ayumi Sakai, Tokyo (JP); Yosuke Watanabe, Tokyo (JP); Yuichi Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 278 days.

(21) Appl. No.: 17/505,725

(22) Filed: Oct. 20, 2021

(65) Prior Publication Data
US 2022/0044843 A1 Feb. 10, 2022

Related U.S. Application Data

(63) Continuation of application No. PCT/JP2019/020709, filed on May 24, 2019.

(51) Int. Cl.
| | | |
|---|---|---|
| *H01B 7/30* | (2006.01) | |
| *H01B 11/18* | (2006.01) | |
| *H01F 17/06* | (2006.01) | |
| *H05K 9/00* | (2006.01) | |

(52) U.S. Cl.
CPC ........... *H01B 7/30* (2013.01); *H01B 11/1834* (2013.01); *H01F 17/06* (2013.01); *H05K 9/00* (2013.01)

(58) Field of Classification Search
None
See application file for complete search history.

(56) References Cited

U.S. PATENT DOCUMENTS

| | | | | |
|---|---|---|---|---|
| 6,144,280 | A * | 11/2000 | Amada | H01F 17/045 |
| | | | | 336/205 |
| 6,650,529 | B1 * | 11/2003 | Murata | H01F 41/041 |
| | | | | 361/268 |
| 7,142,082 | B2 * | 11/2006 | Kakehashi | C12N 15/101 |
| | | | | 29/605 |
| 7,394,340 | B2 * | 7/2008 | Kakehashi | C12Q 1/6827 |
| | | | | 336/182 |
| 8,325,000 | B2 * | 12/2012 | Oki | H01F 27/292 |
| | | | | 336/98 |

(Continued)

FOREIGN PATENT DOCUMENTS

| | | |
|---|---|---|
| JP | 5-159836 A | 6/1993 |
| JP | 5-258959 A | 10/1993 |
| JP | 2002-324712 A | 11/2002 |

OTHER PUBLICATIONS

Chinese Office Action and Search Report for Chinese Application No. 201980096471.8, dated Sep. 27, 2023, with an English translation of the Chinese Office Action.

*Primary Examiner* — Xanthia C Relford
(74) *Attorney, Agent, or Firm* — Birch, Stewart, Kolasch & Birch, LLP (57) ABSTRACT

A noise reduction element includes a protruded portion on which a bent portion of a conductive wire is hooked, and a winder portion around which both a first conductive wire portion extending in one direction from the bent portion of the conductive wire hooked on the protruded portion and a second conductive wire portion extending in another direction from the bent portion of the conductive wire hooked on the protruded portion are wound in a state where the first and second conductive wire portions are parallel to each other.

7 Claims, 4 Drawing Sheets

(56) References Cited

U.S. PATENT DOCUMENTS

| | | | | |
|---|---|---|---|---|
| 8,471,663 | B2* | 6/2013 | Cho | H01F 27/2823 |
| | | | | 336/182 |
| 8,943,899 | B2* | 2/2015 | Jukes | G01F 1/8495 |
| | | | | 73/861.357 |
| 2005/0040093 | A1* | 2/2005 | Yanagisawa | H02M 1/126 |
| | | | | 210/243 |
| 2017/0174152 | A1* | 6/2017 | Yamaguchi | H01F 17/062 |
| 2018/0375261 | A1* | 12/2018 | Iizuka | H02G 3/088 |
| 2021/0327629 | A1* | 10/2021 | Sugawara | H01F 27/306 |

* cited by examiner

NOISE REDUCTION ELEMENT

CROSS REFERENCE TO RELATED APPLICATIONS

This application is a Continuation of PCT International Application No. PCT/JP2019/020709 filed on May 24, 2019, which is hereby expressly incorporated by reference into the present application.

TECHNICAL FIELD

The present disclosure relates to a noise reduction element that reduces noises in a conductive wire.

BACKGROUND ART

Conventionally, a noise reduction element that is mounted in a conductive wire, thereby reducing a noise flowing from the outside into the conductive wire or a noise leaking from the conductive wire to the outside, is known. For example, in Patent Literature 1, a noise absorption element in which a folded-back portion is formed in a conductive wire and the folded-back portion is disposed in an insertion hole in a magnetic molded body is described. The noise absorption element reduces noises through the magnetic molded body's absorption of the noises.

CITATION LIST

Patent Literature

Patent Literature 1: JP 2002-324712 A

SUMMARY OF INVENTION

Technical Problem

For example, because conventional noise absorption elements as described in Patent Literature 1 have a structure of arranging a conductive wire in an insertion hole, there is a problem that the conventional noise absorption elements cannot be applied unless the length of the conductive wire is longer than the length of the insertion hole.

The present disclosure is made in order to solve the above-mentioned problem, and it is therefore an object of the present disclosure to provide a noise reduction element applicable to a conductive wire of any length.

Solution to Problem

A noise reduction element according to the present disclosure includes: a protruded portion on which a bent portion of a conductive wire is hooked; and a winder portion around which both a first conductive wire portion which extends in one direction from the bent portion of the conductive wire hooked on the protruded portion and a second conductive wire portion which extends in another direction from the bent portion of the conductive wire hooked on the protruded portion are wound in a state where the first and second conductive wire portions are parallel to each other.

Advantageous Effects of Invention

The noise reduction element according to the present disclosure can be applied to a conductive wire of any length.

DESCRIPTION OF EMBODIMENTS

Hereinafter, in order to explain the present disclosure in greater detail, embodiments of the present disclosure will be explained with reference to the accompanying drawings.

Embodiment 1

Figure 1:
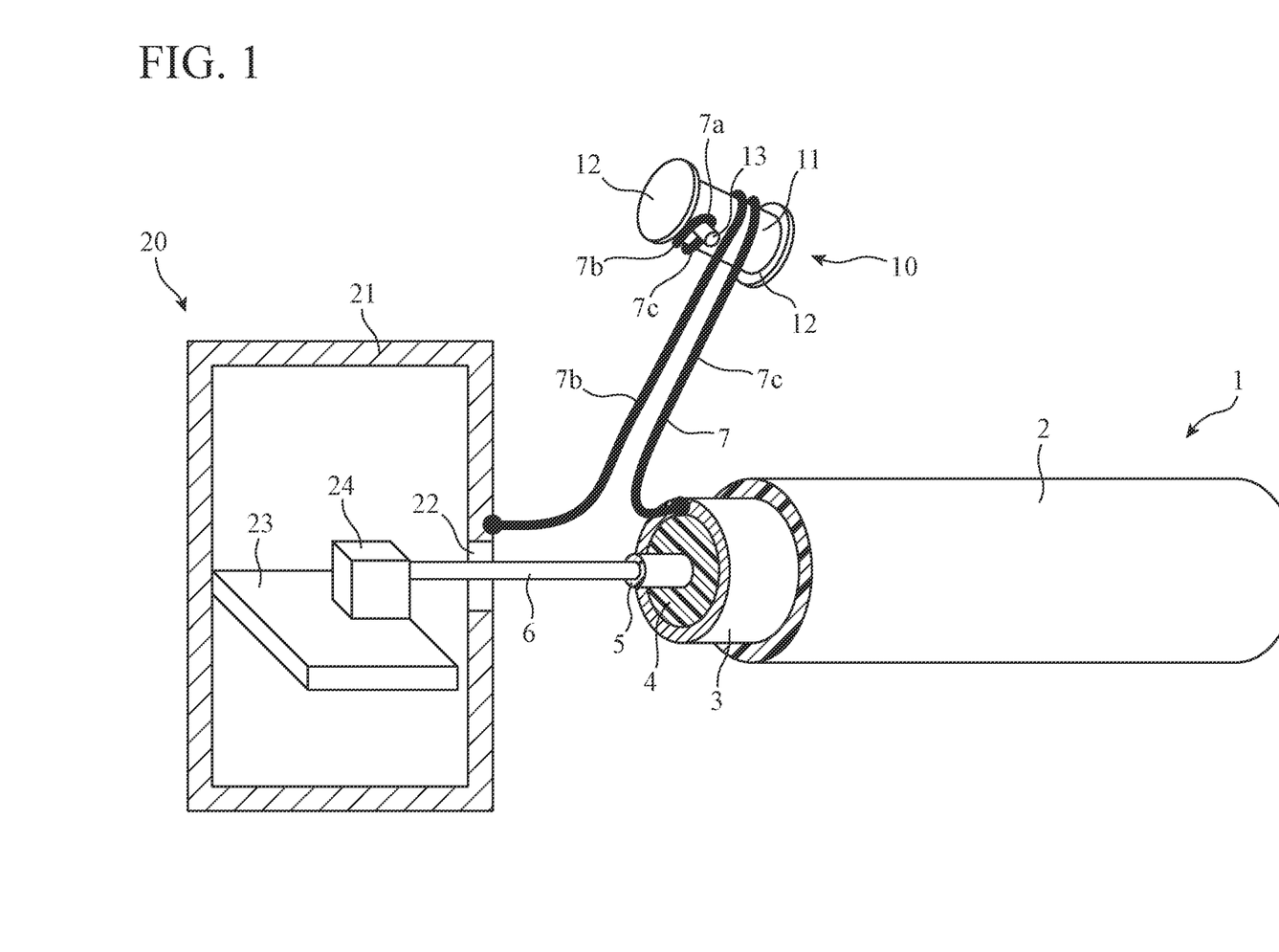
FIG. 1 is a schematic diagram showing an example in which a noise reduction element according to Embodiment 1 is applied to a pigtail that connects a shielded cable and electronic equipment.

FIG. 1 is a schematic diagram showing an example in which a noise reduction element 10 according to Embodiment 1 is applied to a pigtail 7 that connects a shielded cable and electronic equipment 20. In Embodiment 1, the electronic equipment 20 is, for example, communication equipment. As shown in FIG. 1, the shielded cable 1 in Embodiment 1 is a coaxial cable in which an outer conductor coating member 2, an outer conductor 3, a resin interposing portion 4, an inner conductor coating member 5, and an inner conductor 6 are concentrically arranged in order from the outside of the coaxial cable.

The material of the outer conductor coating member 2 is, for example, resin. The outer conductor coating member 2 surrounds the outer conductor 3, thereby protecting the outer conductor 3. The outer conductor 3 is constituted by, for example, forming a shield element wire made of metal having high conductivity, such as copper, into a mesh form. The outer conductor 3 surrounds the inner conductor 6 via the resin interposing portion 4 and the inner conductor coating member 5, thereby blocking out a noise flowing from the outside into the inner conductor 6, and also blocking out a noise leaking from the inner conductor 6 to the outside.

The resin interposing portion 4 surrounds the inner conductor coating member 5 and the inner conductor 6, thereby holding the inner conductor coating member 5 and the inner conductor 6. The material of the inner conductor coating member 5 is, for example, resin. The inner conductor coating member 5 surrounds the inner conductor 6, thereby protecting the inner conductor 6. The inner conductor 6 is one for transmitting a signal. The inner conductor 6 is made of, for example, copper having high conductivity or the like.

The electronic equipment 20 includes, in a housing 21, a board 23 and a connector 24 mounted on the board 23. The housing 21 in Embodiment 1 is a metal case having conductivity, and is connected to the ground. Further, an opening 22 is formed in a side surface of the housing 21.

The inner conductor 6 extends toward the electronic equipment 20, passes through the opening 22, and is connected to the connector 24. Through this connection, the shielded cable 1 can transmit signals transmitted and received between the electronic equipment 20 and not-illustrated external equipment.

On the other hand, the outer conductor 3 of the shielded cable 1 is connected to the housing 21 of the electronic equipment 20 via the pigtail 7. The pigtail 7 is, for example, a conductive wire made of metal having conductivity, such as copper. The outer conductor 3 is connected to the housing 21 of the electronic equipment 20 via the pigtail 7, so that the outer conductor 3 is connected to the ground.

Figure 2:
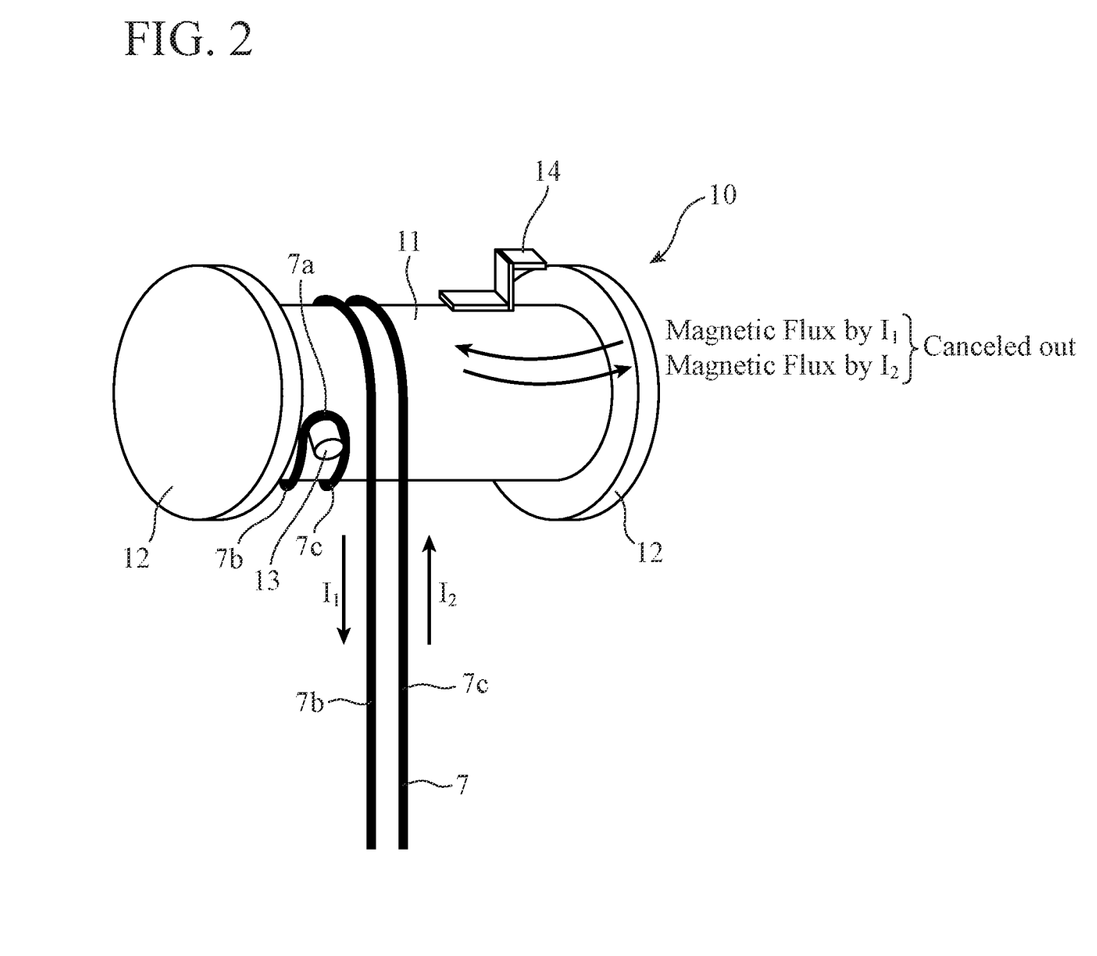
FIG. 2 is an enlarged view in which the noise reduction element shown in FIG. 1 is enlarged.

Next, the noise reduction element 10 according to Embodiment 1 will be explained with reference to a drawing. FIG. 2 is an enlarged view in which the noise reduction element 10 shown in FIG. 1 is enlarged. As shown in FIG. 2, the noise reduction element 10 includes a cylindrical magnetic body 11 which is a winder portion around which the pigtail 7 is wound, and a protruded portion 13 on which a bent portion 7a of the pigtail 7 is hooked. The bent portion 7a will be mentioned later. The protruded portion 13 is formed on a side surface of the cylindrical magnetic body 11. Further, a flange 12 is formed on each of two bottom surfaces of the cylindrical magnetic body 11, and a flat spring type stopper 14 is provided on the side surface of the cylindrical magnetic body 11. The material of the flat spring type stopper 14 is, for example, resin or metal.

As shown in FIG. 2, the pigtail 7 is bent at a point where the pigtail is hooked on the protruded portion 13. This bent point in the pigtail 7 forms the bent portion 7a. From the bent portion 7a of the pigtail 7 hooked on the protruded portion 13, a first conductive wire portion 7b extends in one direction and a second conductive wire portion 7c extends in another direction. The first conductive wire portion 7b and the second conductive wire portion 7c are wound around the side surface of the cylindrical magnetic body 11 in a state where the first and second conductive wire portions are parallel to each other.

Although in FIG. 2 the first conductive wire portion 7b and the second conductive wire portion 7c are wound, approximately one turn, around the side surface of the cylindrical magnetic body 11, the number of turns that the first conductive wire portion 7b and the second conductive wire portion 7c are wound around the side surface of the cylindrical magnetic body 11 is not particularly limited. More specifically, the first conductive wire portion 7b and the second conductive wire portion 7c can be wound, any turns, around the side surface of the cylindrical magnetic body 11 depending on the length of the pigtail 7. For example, the first conductive wire portion 7b and the second conductive wire portion 7c may be wound, less than one turn, around the side surface of the cylindrical magnetic body 11, or may be wound, equal to or greater than one turn, around the side surface of the cylindrical magnetic body 11. Therefore, the noise reduction element 10 according to Embodiment 1 can be applied to a pigtail 7 of any length. Further, because the noise reduction element 10 does not have a structure of covering the pigtail 7 with a magnetic body, the noise reduction element 10 can also be applied to a pigtail 7 of any thickness. More specifically, the noise reduction element 10 according to Embodiment 1 can be applied to a pigtail 7 of any length or any thickness.

The pigtail 7 to which the noise reduction element 10 according to Embodiment 1 can be applied needs to have a length or thickness with a degree which enables the pigtail to be hooked on the protruded portion 13. Therefore, the above-mentioned "any length or thickness" means "any length or thickness" that is a length or thickness with the above-mentioned degree.

At each of the bottom surfaces of the cylinder of the cylindrical magnetic body 11, the flange 12 of the noise reduction element 10 has a circumference longer than that of the cylinder. Therefore, the movement areas of the first conductive wire portion 7b and the second conductive wire portion 7c of the pigtail 7 wound around the side surface of the cylindrical magnetic body 11 are restricted by the flanges 12, so that the first and second conductive wire portions are hard to displace outwardly from the ends of the cylinder. Further, for example, by placing the winding end portions of the first conductive wire portion 7b and the second conductive wire portion 7c of the pigtail 7 between the flange 12 on a right-hand side of FIG. 2 and the flat spring type stopper 14, the winding end portions can be fixed between the flange 12 and the flat spring type stopper 14. As an alternative, the winding end portions may be fixed by forming a slit in the flange 12, and inserting the winding end portions of the first conductive wire portion 7b and the second conductive wire portion 7c of the pigtail 7 into the slit. Although the shape of the flange 12 shown in FIGS. 1 and 2 is a circle, the shape may be a polygon such as a rectangle.

Next, an effect provided by the structure in which in the noise reduction element 10 the first conductive wire portion 7b and the second conductive wire portion 7c of the pigtail 7 are wound around the side surface of the cylindrical magnetic body 11 in the state where the first and second conductive wire portions are parallel to each other will be explained. As shown in FIG. 2, when a current flows through the pigtail 7, a current $I_1$ flows through the first conductive wire portion 7b, and a current $I_2$ flows through the second conductive wire portion 7c. Then, a magnetic flux induced by the current $I_1$ flowing through the first conductive wire portion 7b and a magnetic flux induced by the current $I_2$ flowing through the second conductive wire portion 7c are concentrated into the cylindrical magnetic body 11. As shown in FIG. 2, because the currents $I_1$ and $I_2$ are oriented in opposite directions to each other, the induced magnetic flux lines are also oriented in opposite directions to each other, and thus these magnetic flux lines are canceled out inside the cylindrical magnetic body 11.

In Embodiment 1, the case in which the outer conductor 3 of the shielded cable 1 is connected, via the pigtail 7, to the housing 21 of the electronic equipment 20 is assumed. For example, in industrial equipment and the likes in which many signal lines are often connected, multiple signal lines may be integrated into the single connector 24 so that various signals including from analog signals to high-speed digital signals are transmitted between multiple pieces of equipment having different functions. Further, in a case where the size of the connector 24 is predetermined and a thin shielded cable 1 needs to be connected to the connector 24, the metal case of the connector 24 and the outer conductor coating member 2 of the shielded cable 1 may not be engaged with each other even though the inner conductor 6 of the shielded cable 1 can be connected to a connector pin. In each of the above cases, a pigtail 7 is used.

In the case where a pigtail 7 is used for the connection between the outer conductor 3 and the housing 21, an inductance occurs in the pigtail 7, and thereby a connection impedance becomes high particularly for high frequency noises. Therefore, in the case where a pigtail 7 is used for the connection, the ability of the shielded cable 1 to block out noises from the outside (referred to as "noise resistance" hereinafter), or the ability of the shielded cable 1 to block out noises leaking from the inner conductor 6 (referred to as "shielding performance" hereinafter) degrades. Therefore, from the viewpoint of suppressing the degradation of the noise resistance and the shielding performance, it is preferable to shorten the length of the pigtail 7 as much as possible. However, if the outer conductor 3 and the housing 21 are connected using a pigtail 7 having a short length, the movable area of the shielded cable 1 in the vicinity of this connected point becomes narrow, and thereby the work of installing the shielded cable 1, and so on may become difficult. Therefore, taking the workability into consideration, there is a case in which the pigtail 7 must have a certain or longer length.

When the noise reduction element 10 according to Embodiment 1 is applied to this case, the magnetic flux induced by the current $I_1$ flowing through the first conductive wire portion 7b and the magnetic flux induced by the current $I_2$ flowing through the second conductive wire portion 7c are canceled out, as mentioned above. Then, because the magnetic flux induced by the current flowing through the pigtail 7 and the inductance of the pigtail 7 are substantially proportional to each other, the inductance of the pigtail 7 is canceled out in a section where the magnetic fluxes in the pigtail 7 are canceled out. Accordingly, as a result, the connection impedance due to the connection of the pigtail 7 can be suppressed. Canceling out a part of the inductance of the pigtail 7 as above produces an effect of particularly suppressing a rise of the impedance which is caused by high frequency noises. As mentioned above, the degradation of the shielding performance and the noise resistance of the shielded cable 1 can be suppressed by suppressing the connection impedance of the pigtail 7.

Although in the noise reduction element 10 according to Embodiment 1 the cylindrical magnetic body 11 is used as the winder portion around which the pigtail 7 is wound, the winder portion may be other than a magnetic body. For example, also in a case where the winder portion is made of a material other than a magnetic body, the magnetic flux induced by the current $I_1$ flowing through the first conductive wire portion 7b and the magnetic flux induced by the current $I_2$ flowing through the second conductive wire portion 7c can be canceled out. Further, the shape of the cylindrical magnetic body 11 may be a shape other than a correct cylindrical shape. Further, the shape of the flange 12 may be a polygon instead of a circle. Further, the protruded portion 13 may also have a shape other than a cylindrical shape.

Further, although in Embodiment 1 the structure in which the single connector 24 is connected to the single inner conductor 6 in the single shielded cable 1 is explained, the connection relationship between the connector 24 and the shielded cable 1 or the inner conductor 6, to which the noise reduction element 10 can be applied, is not limited to this structure. More specifically, also in a case where the single shielded cable 1 includes multiple inner conductors 6 and multiple connectors 24 are provided for the single shielded cable 1, or in a case where the single connector 24 is provided for multiple shielded cables 1, the noise reduction element 10 can be applied to a pigtail 7 that connects the outer conductor 3 of the shielded cable 1 and the housing 21 of the electronic equipment 20.

Further, although in Embodiment 1 the structure in which the shielded cable 1 is connected to the electronic equipment 20 is explained, also in, for example, a structure in which the shielded cable 1 is connected to a relay connector, the ground of the relay connector and the outer conductor 3 of the shielded cable 1 may be connected using a pigtail, and the noise reduction element 10 may be applied to this pigtail.

Further, although in this Embodiment the structure in which the noise reduction element 10 is applied to a pigtail 7 is explained, the noise reduction element 10 can be applied not only to a pigtail, but also to a structural component having the same problem. For example, in a case in which it is demanded to suppress the impedance in an earth wire that connects the grounds of pieces of electronic equipment, a cable line to an external filter, or the like, the noise reduction element 10 can be applied to these conductive wires.

As mentioned above, the noise reduction element 10 according to Embodiment 1 includes the protruded portion 13 on which the bent portion 7a of the conductive wire is hooked, and the winder portion around which both the first conductive wire portion 7b extending in one direction from the bent portion 7a of the conductive wire hooked on the protruded portion 13 and the second conductive wire portion 7c extending in another direction from the bent portion 7a of the conductive wire hooked on the protruded portion 13 are wound in the state where the first and second conductive wire portions are parallel to each other.

According to the above-mentioned structure, the conductive wire can be wound, any turns, around the winder portion. Therefore, the noise reduction element 10 can be applied to a conductive wire of any length. Further, because the noise reduction element 10 does not have a structure of covering the conductive wire with a magnetic body, a conductive wire of any thickness can be used. More specifically, the noise reduction element 10 can be applied to a pigtail 7 of any length or thickness.

Further, because the magnetic flux induced by the current $I_1$ flowing through the first conductive wire portion 7b and the magnetic flux induced by the current $I_2$ flowing through the second conductive wire portion 7c are canceled out, the inductance of the conductive wire is canceled out in the section where the magnetic fluxes in the conductive wire are canceled out. Accordingly, as a result, the connection impedance due to the connection of the conductive wire can be suppressed. Therefore, the degradation of the shielding performance and the noise resistance of the shielded cable 1 can be suppressed.

Further, in the noise reduction element 10 according to Embodiment 1, the winder portion is a cylinder, the protruded portion 13 is formed on the side surface of the cylinder, and the first conductive wire portion 7b and the second conductive wire portion 7c are wound around the side surface of the cylinder in the state where the first and second conductive wire portions are parallel to each other.

According to the above-mentioned structure, the conductive wire can be wound, any turns, around the side surface of the cylinder which is the winder portion. Therefore, the noise reduction element 10 can be applied to a conductive wire of any length.

Further, in the noise reduction element 10 according to Embodiment 1, the flange 12 is formed on each of the two bottom surfaces of the cylinder which is the winder portion.

According to the above-mentioned structure, the first conductive wire portion 7b and the second conductive wire portion 7c which are wound around the side surface of the cylinder are hard to displace outwardly from the ends of the cylinder.

Further, in the noise reduction element 10 according to Embodiment 1, the conductive wire is the pigtail 7 that connects the outer conductor 3 of the shielded cable 1 and the housing 21 of the electronic equipment 20.

According to the above-mentioned structure, the pigtail 7 can be wound, any turns, around the winder portion. Therefore, the noise reduction element 10 can be applied to a pigtail of any length. Further, because the noise reduction element 10 does not have a structure of covering the pigtail 7 with a magnetic body, a pigtail of any thickness can be used. More specifically, the noise reduction element 10 can be applied to a pigtail of any length or thickness.

Further, because the magnetic flux induced by the current $I_1$ flowing through the first conductive wire portion 7b and the magnetic flux induced by the current $I_2$ flowing through the second conductive wire portion 7c are canceled out, the inductance of the pigtail 7 is canceled out in the section where the magnetic fluxes in the pigtail 7 are canceled out. Accordingly, as a result, the connection impedance due to the connection of the pigtail 7 can be suppressed. Therefore, the degradation of the shielding performance and the noise resistance of the shielded cable 1 can be suppressed.

Further, in the noise reduction element 10 according to Embodiment 1, the winder portion is the cylindrical magnetic body 11.

According to the above-mentioned structure, the conductive wire can be wound, any turns, around the cylindrical magnetic body 11. More specifically, the noise reduction element 10 can be applied to a conductive wire of any length.

Further, because the magnetic flux induced by the current $I_1$ flowing through the first conductive wire portion 7b and the magnetic flux induced by the current $I_2$ flowing through the second conductive wire portion 7c are concentrated into the cylindrical magnetic body 11 and canceled out, the inductance of the conductive wire is canceled out in the section where the magnetic fluxes in the conductive wire are canceled out. Accordingly, as a result, the connection impedance due to the connection of the conductive wire can be suppressed. Therefore, the degradation of the shielding performance and the noise resistance of the shielded cable 1 can be suppressed.

Embodiment 2

Figure 3:
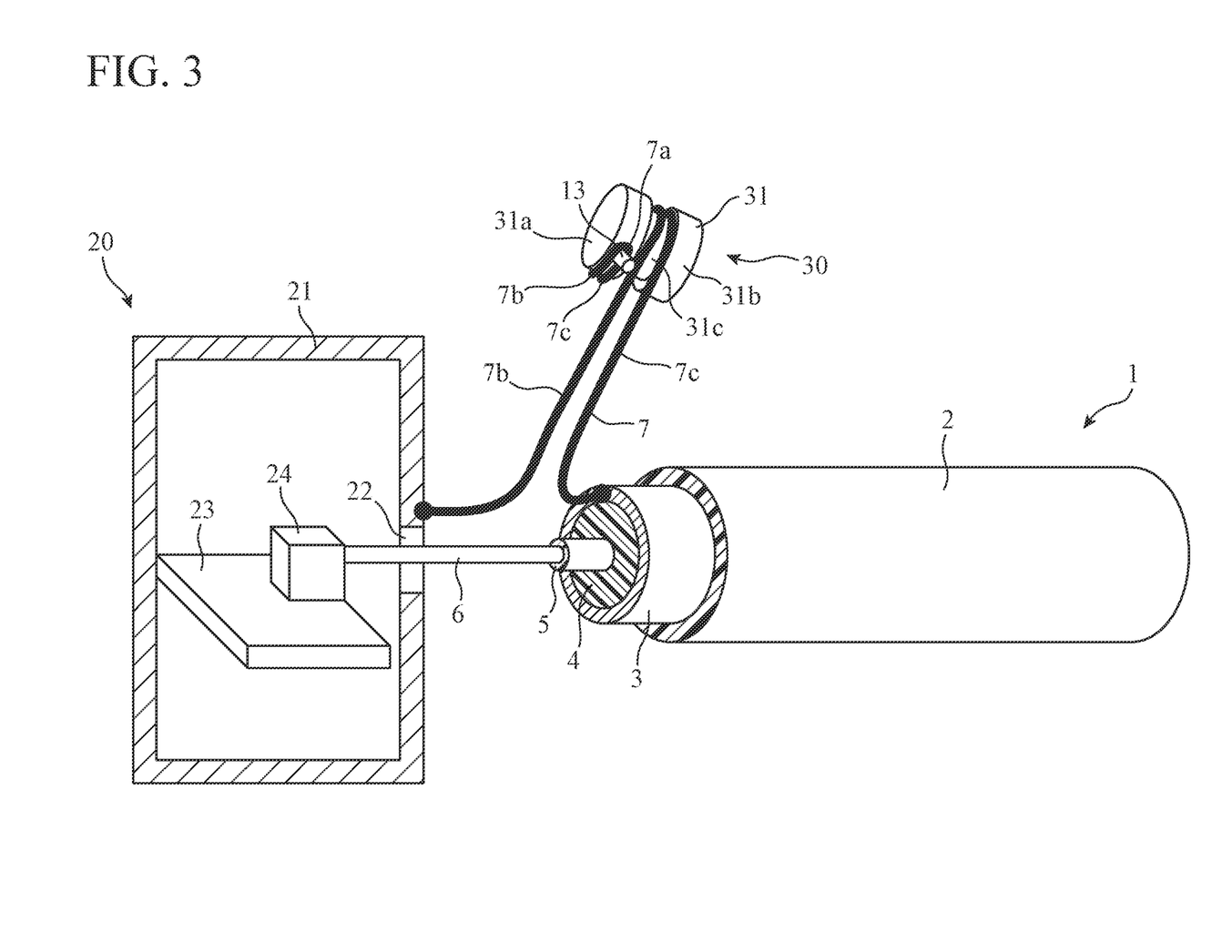
FIG. 3 is a schematic diagram showing an example in which a noise reduction element according to Embodiment 2 is applied to a pigtail that connects a shielded cable and electronic equipment.

In Embodiment 1, the structure of using the cylindrical magnetic body 11 as the winder portion around which the pigtail 7 is wound is explained. In Embodiment 2, a structure of using a cylindrical magnetic body 31 partially different in structure from the cylindrical magnetic body 11 as a winder portion around which a pigtail 7 is wound will be explained.

Hereinafter, Embodiment 2 will be explained with reference to a drawing. Components having the same functions as those of components explained in Embodiment 1 are denoted by the same reference signs, and an explanation of the components will be omitted.

FIG. 3 is a schematic diagram showing an example in which a noise reduction element 30 according to Embodiment 2 is applied to a pigtail 7 that connects a shielded cable 1 and electronic equipment 20. As shown in FIG. 3, the noise reduction element 30 includes a cylindrical magnetic body 31 which is a winder portion around which the pigtail 7 is wound, and a protruded portion 13 on which a bent portion 7a of the pigtail 7 is hooked. In further detail, the cylindrical magnetic body 31 includes a first cylindrical portion 31a including one of bottom surfaces of the cylindrical magnetic body 31, a second cylindrical portion 31b including the other one of the bottom surfaces, and a third cylindrical portion 31c located between the first cylindrical portion 31a and the second cylindrical portion 31b, the first, second, and third cylindrical portions having an identical axis. The protruded portion 13 is formed on a side surface of the first cylindrical portion 31a. The circumference of the first cylindrical portion 31a and the circumference of the second cylindrical portion 31b are equal, and the circumference of the third cylindrical portion 31c is shorter than the circumference of the first cylindrical portion 31a and the circumference of the second cylindrical portion 31b. More specifically, the cylindrical magnetic body 31 according to Embodiment 2 differs from the cylindrical magnetic body 11 according to Embodiment 1 in that the cylindrical magnetic body 31 has a shape with a dent at a central portion.

In the noise reduction element 30, the bent portion 7a of the pigtail 7 is hooked on the protruded portion 13 formed on the side surface of the first cylindrical portion 31a. From the bent portion 7a of the pigtail 7 hooked on the protruded portion 13, a first conductive wire portion 7b extends in one direction and a second conductive wire portion 7c extends in another direction. The first conductive wire portion 7b and the second conductive wire portion 7c are wound around a side surface of the third cylindrical portion 31c in a state where the first and second conductive wire portions are parallel to each other.

As mentioned above, in the noise reduction element 30 according to Embodiment 2, the shape of the winder portion is constituted by the first cylindrical portion 31a including one of the bottom surfaces of the winder portion, the second cylindrical portion 31b including the other one of the bottom surfaces, and the third cylindrical portion 31c located between the first cylindrical portion 31a and the second cylindrical portion 31b, the first, second, and third cylindrical portions having an identical axis. Further, the protruded portion 13 is formed on the side surface of the first cylindrical portion 31a, the circumference of the first cylindrical portion 31a and the circumference of the second cylindrical portion 31b are equal, the circumference of the third cylindrical portion 31c is shorter than the circumference of the first cylindrical portion 31a and the circumference of the second cylindrical portion 31b, and the first conductive wire portion 7b and the second conductive wire portion 7c are wound around the side surface of the third cylindrical portion 31c in the state where the first and second conductive wire portions are parallel to each other.

According to the above-mentioned structure, the same advantages as those provided by the noise reduction element 10 according to Embodiment 1 are provided. Further, as mentioned above, because the circumference of the third cylindrical portion 31c is shorter than the circumference of the first cylindrical portion 31a and the circumference of the second cylindrical portion 31b, the first conductive wire portion 7b and the second conductive wire portion 7c are in a state where the first and second conductive wire portions are sandwiched between the bottom surface of the first cylindrical portion 31a and the bottom surface of the second cylindrical portion 31b. As a result, the first cylindrical portion 31a and the second cylindrical portion 31b serve as obstacles, and therefore the first conductive wire portion 7b and the second conductive wire portion 7c which are wound around the side surface of the third cylindrical portion 31c are hard to displace outwardly from the ends of the side surface of the third cylindrical portion 31c.

Embodiment 3

Figure 4:
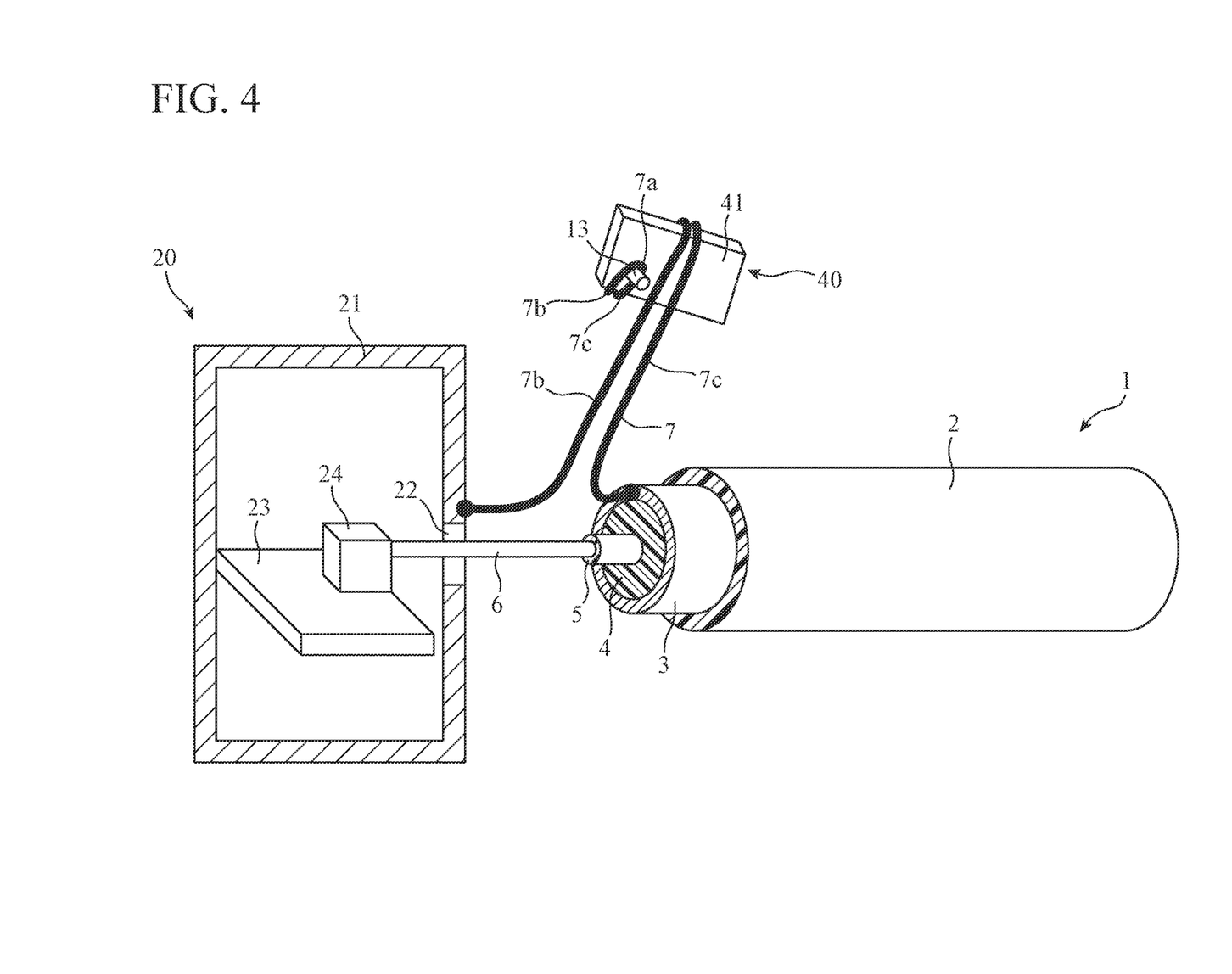
FIG. 4 is a schematic diagram showing an example in which a noise reduction element according to Embodiment 3 is applied to a pigtail that connects a shielded cable and electronic equipment.

In Embodiments 1 and 2, the structure of using the cylindrical magnetic body 11 or the cylindrical magnetic body 31 as the winder portion around which the pigtail 7 is wound is explained. In Embodiment 3, a structure of using a rectangular parallelepiped-shaped magnetic body 41 as a winder portion around which a pigtail 7 is wound will be explained.

Hereinafter, Embodiment 3 will be explained with reference to a drawing. Components having the same functions as those of components explained in Embodiment 1 are denoted by the same reference signs, and an explanation of the components will be omitted.

FIG. 4 is a schematic diagram showing an example in which a noise reduction element 40 according to Embodiment 3 is applied to a pigtail 7 that connects a shielded cable 1 and electronic equipment 20. As shown in FIG. 4, the noise reduction element 40 includes the rectangular parallelepiped-shaped magnetic body 41 which is the winder portion around which the pigtail 7 is wound, and a protruded portion 13 on which a bent portion 7a of the pigtail 7 is hooked. In FIG. 4, the protruded portion 13 is formed on a surface having the largest area, out of the six surfaces of the rectangular parallelepiped; however, the protruded portion 13 should just be formed on any one of the six surfaces of the rectangular parallelepiped.

In the noise reduction element 40, the bent portion 7a of the pigtail 7 is hooked on the protruded portion 13 formed on one side surface of the rectangular parallelepiped-shaped magnetic body 41. From the bent portion 7a of the pigtail 7 hooked on the protruded portion 13, a first conductive wire portion 7b extends in one direction and a second conductive wire portion 7c extends in another direction. The first conductive wire portion 7b and the second conductive wire portion 7c are wound around the perimeter of the rectangular parallelepiped-shaped magnetic body 41 in a state where the first and second conductive wire portions are parallel to each other.

As mentioned above, in the noise reduction element 40 according to Embodiment 3, the shape of the winder portion is a rectangular parallelepiped, the protruded portion 13 is formed on any one of the six surfaces of the rectangular parallelepiped, and the first conductive wire portion 7b and the second conductive wire portion 7c are wound around the perimeter of the rectangular parallelepiped in the state where the first and second conductive wire portions are parallel to each other.

According to the above-mentioned structure, the same advantages as those provided by the noise reduction element 10 according to Embodiment 1 are provided. More specifically, according to above-mentioned Embodiments 1, 2, and 3, the winder portion around which the pigtail 7 is wound can have one of various shapes. At the least, the winder portion should just have a shape making it possible for the first conductive wire portion 7b and the second conductive wire portion 7c through which currents flow in mutually opposite directions to be wound therearound in the state where the first and second conductive wire portions are parallel to each other. Because the winder portion around which the pigtail 7 is wound can have one of various shapes, as mentioned above, the noise reduction element of the present disclosure can be applied to various conductive wires.

It is to be understood that any combination of two or more of the above-mentioned embodiments can be made, various changes can be made in any component according to any one of the above-mentioned embodiments, or any component according to any one of the above-mentioned embodiments can be omitted within the scope of the present disclosure.

INDUSTRIAL APPLICABILITY

Because the noise reduction element according to the present disclosure can be applied to a conductive wire of any length, the noise reduction element can be used as a noise reduction element that reduces noises in a conductive wire.

REFERENCE SIGNS LIST 1 shielded cable, 2 outer conductor coating member, 3 outer conductor, 4 resin interposing portion, 5 inner conductor coating member, 6 inner conductor, 7 pigtail, 7a bent portion, 7b first conductive wire portion, 7c second conductive wire portion, 10 noise reduction element, 11 cylindrical magnetic body, 12 flange, 13 protruded portion, 14 flat spring type stopper, 20 electronic equipment, 21 housing, 22 opening, 23 board, 24 connector, 30 noise reduction element, 31 cylindrical magnetic body, 31a first cylindrical portion, 31b second cylindrical portion, 31c third cylindrical portion, 40 noise reduction element, and 41 rectangular parallelepiped-shape magnetic body.

The invention claimed is:

1. A noise reduction element comprising:
a protruded portion on which a bent portion of a conductive wire is hooked; and
a winder portion around which both a first conductive wire portion which extends in one direction from the bent portion of the conductive wire hooked on the protruded portion and a second conductive wire portion which extends in another direction from the bent portion of the conductive wire hooked on the protruded portion are wound in a state where the first and second conductive wire portions are parallel to each other.

2. The noise reduction element according to claim 1, wherein
a shape of the winder portion is a cylinder,
the protruded portion is formed on a side surface of the cylinder, and
the first conductive wire portion and the second conductive wire portion are wound around the side surface of the cylinder in a state where the first and second conductive wire portions are parallel to each other.

3. The noise reduction element according to claim 2, wherein on two bottom surfaces of the cylinder, respective flanges are formed.

4. The noise reduction element according to claim 1, wherein
the winder portion includes a first cylindrical portion including one of bottom surfaces of the winder portion, a second cylindrical portion including another one of the bottom surfaces, and a third cylindrical portion located between the first cylindrical portion and the second cylindrical portion, the first, second, and third cylindrical portions having an identical axis,
the protruded portion is formed on a side surface of the first cylindrical portion,
circumference of the first cylindrical portion and circumference of the second cylindrical portion are equal,
circumference of the third cylindrical portion is shorter than the circumference of the first cylindrical portion and the circumference of the second cylindrical portion, and
the first conductive wire portion and the second conductive wire portion are wound around a side surface of the third cylindrical portion in a state where the first and second conductive wire portions are parallel to each other.

5. The noise reduction element according to claim 1, wherein a shape of the winder portion is a rectangular parallelepiped, the protruded portion is formed on any one of six surfaces of the rectangular parallelepiped, and the first conductive wire portion and the second conductive wire portion are wound around a perimeter of the rectangular parallelepiped in a state where the first and second conductive wire portions are parallel to each other.

6. The noise reduction element according to claim 1, wherein the conductive wire is a pigtail for connecting an outer conductor of a shielded cable and a housing of electronic equipment.

7. The noise reduction element according to claim 1, wherein the winder portion is a magnetic body.

* * * * *